US010222411B2

United States Patent
Lin et al.

(10) Patent No.: US 10,222,411 B2
(45) Date of Patent: Mar. 5, 2019

(54) GROUNDING SAFETY CONTROL POINT MONITORING METHOD, MEASURING CIRCUIT AND EQUIPMENT GROUNDING MEASURING SYSTEM

(71) Applicant: Universal Global Technology (Kunshan) Co., Ltd., Jiangsu Province (CN)

(72) Inventors: Ta-I Lin, Jiangsu Province (CN); Shulei Zhao, Jiangsu Province (CN); Zhizheng Qian, Jiangsu Province (CN); Jiahua Ren, Jiangsu Province (CN); Xiaodong Lu, Jiangsu Province (CN); Shang Liu, Jiangsu Province (CN)

(*) Notice: Subject to any disclaimer, the term of this patent is extended or adjusted under 35 U.S.C. 154(b) by 357 days.

(21) Appl. No.: 15/221,636

(22) Filed: Jul. 28, 2016

(65) Prior Publication Data
US 2017/0033548 A1   Feb. 2, 2017

(30) Foreign Application Priority Data

Jul. 31, 2015   (CN) .................... 2015 2 0570774 U
Aug. 21, 2015  (CN) ......................... 2015 1 0518629

(51) Int. Cl.
| | | |
|---|---|---|
| *G01R 31/08* | (2006.01) | |
| *G01R 31/02* | (2006.01) | |
| *H02H 3/14* | (2006.01) | |

(52) U.S. Cl.
CPC ............. *G01R 31/025* (2013.01); *H02H 3/14* (2013.01)

(58) Field of Classification Search
USPC ........................................................ 324/525
See application file for complete search history.

(56) References Cited

U.S. PATENT DOCUMENTS

| | | | | |
|---|---|---|---|---|
| 4,781,535 A | * | 11/1988 | Frawley ................ | F04B 43/009 340/605 |
| 5,576,695 A | * | 11/1996 | Minger .................. | G01R 27/18 198/358 |
| 5,894,393 A | * | 4/1999 | Elliott .................... | H02H 5/105 361/115 |
| 8,134,820 B1 | * | 3/2012 | Riccio ...................... | H02H 3/20 361/195 |
| 2002/0181178 A1 | * | 12/2002 | Ortiz ....................... | H02H 3/38 361/78 |

(Continued)

*Primary Examiner* — Ronald W Leja
(74) *Attorney, Agent, or Firm* — Prakash Nama; Global IP Services, PLLC

(57) ABSTRACT

The invention provides grounding safety control point monitoring method, measuring circuit and equipment grounding measuring system, wherein, The grounding safety control point monitoring method comprises the following steps: A safety monitoring level signal corresponding to each circuit is output according to the comparison result of the voltage between the grounding safety control points of at least one circuit and the preset grounding safety standard voltage; one circuit of safety action level signal is adjusted and output according to at least one circuit of input safety monitoring level signal; grounding safety protection is done according to the safety action level signal. All grounding points are monitored in real time by comparing the voltage between grounding safety control points with preset grounding safety standard voltage, so as to guarantee the product safety, equipment safety and personal safety.

14 Claims, 4 Drawing Sheets

(56) References Cited

U.S. PATENT DOCUMENTS

| | | | |
|---|---|---|---|
| 2014/0254050 A1* | 9/2014 | Haines | G01R 31/3277 |
| | | | 361/42 |
| 2014/0375326 A1* | 12/2014 | Tornare | G01R 31/006 |
| | | | 324/503 |
| 2015/0214718 A1* | 7/2015 | Rubython | H02H 3/08 |
| | | | 361/88 |
| 2016/0240022 A1* | 8/2016 | Tornare | G01R 31/026 |
| 2016/0306001 A1* | 10/2016 | Taylor | G01R 31/026 |
| 2017/0234923 A1* | 8/2017 | Douglas | G01R 31/2829 |
| | | | 324/750.3 |
| 2017/0364040 A1* | 12/2017 | Ni | G01R 31/026 |

\* cited by examiner

GROUNDING SAFETY CONTROL POINT MONITORING METHOD, MEASURING CIRCUIT AND EQUIPMENT GROUNDING MEASURING SYSTEM

BACKGROUND OF THE INVENTION

The invention relates to the technical field of electronics, in particular to a grounding safety control point monitoring method for equipment grounding, a measuring circuit and an equipment grounding measuring system.

With the development of science and technology, automatic equipment has been increasingly widely applied in production and manufacturing. As we all know, in order to guarantee the safety of the automatic production equipment during use, the equipment needs to be grounded, the metal shell of the equipment and metal parts which are not electrified normally are grounded by leads, so that the metal shell and the metal parts have the same potential with the ground; therefore, when the equipment fails to work, the leaked current of the metal shell and the metal parts can be smoothly lead into the ground, and there is no risk of electric shock even if people touch the parts.

The test station equipment of an FCT (Functional Circuit Test) is such automatic equipment which is directly grounded through leads during use. However, although existing test station equipment is grounded and protected during use, the equipment cannot monitor the grounding of the equipment in real time. As a result, when the grounding of the equipment fails, an operator cannot know the fault in time, and such serious consequences as product damage, equipment damage, personal safety harm, etc. may be caused.

BRIEF SUMMARY OF THE INVENTION

In order to solve the problems, the invention aims to provide the grounding safety control point monitoring method, the measuring circuit and the equipment grounding measuring system. In the test station equipment, all grounding points are monitored in real time by comparing the voltage between grounding safety control points with preset grounding safety standard voltage, so as to guarantee the product safety, equipment safety and personal safety.

The invention adopts the following technical scheme:

The grounding safety control point monitoring method comprises the following steps: A safety monitoring level signal corresponding to each circuit is output according to the comparison result of the voltage between the grounding safety control points of at least one circuit and the preset grounding safety standard voltage; one circuit of safety action level signal is adjusted and output according to at least one circuit of input safety monitoring level signal; grounding safety protection is done according to the safety action level signal.

Preferably, the step that the safety monitoring level signal corresponding to each circuit is output according to the comparison result of the voltage between the grounding safety control points of at least one circuit and the preset grounding safety standard voltage further comprises:

The grounding safety standard voltage is obtained according to a first power supply, a first resistor and a second resistor which are connected onto the first power supply and through a resistance division method between the first and the second resistors;

The voltage between the grounding safety control points is obtained and output according to a second power supply, a third resistor which is connected onto the second power supply and resistors between control points to be measured and through the resistance division method of the third resistor and the resistors between control points to be measured.

The grounding safety standard voltage is obtained and output according to the first power supply, the first resistor and the second resistor;

The voltage between the grounding safety control points is obtained and output according to the second power supply, the third resistor and the resistors between control points to be measured.

In the technical scheme, the comparison result depends on the voltage between both ends of the resistors between control points to be measured (i.e. the voltage between the said control points) and the voltage on both ends of the second resistor (i.e. the preset grounding safety standard voltage), while the voltage on both ends of the resistors between control points to be measured depends on the ratio of the resistors between control points to be measured-to-(the resistors between control points to be measured+the third resistor) and the second power supply, and the voltage on both ends of the second resistor depends on the ratio of the second resistor/(the first resistor+the second resistor) and the first power supply; if the voltage on both ends of the resistors between control points to be measured is higher than that on both ends of the second resistor, high level is output according to the comparison result; if the voltage on both ends of the resistors between control points to be measured is lower than that on both ends of the second resistor, low level is output according to the comparison result; thus, in actual application, that whether the equipment is well grounded or not can be known by monitoring the resistance of the resistors between control points to be measured, so as to realize the monitoring to the grounding of the grounding safety equipment to be monitored.

More preferably, the step that one circuit of safety action level signal is adjusted and output according to at least one circuit of input safety monitoring level signal further comprises: a first selection control level signal is output according to each pair of safety monitoring level signals through a logical selection method; wherein, if any one circuit of safety monitoring level signals are not in pair, the first selection control level signal is directly output.

More preferably, the step that one circuit of safety action level signal is adjusted and output according to at least one circuit of input safety monitoring level signal further comprises: the safety action level signal is output according to a plurality of circuit of first selection control level signal and through the logical selection method.

More preferably, the step that one circuit of safety action level signal is adjusted and output according to eight circuits of safety monitoring level signal further comprises: the first selection control level signal is output according to each pair of safety monitoring level signals and through the logical selection method; a second selection control level signal is output according to each pair of first selection control level signal and through the logical selection method; the safety action level signal is output according to a plurality of circuit of second selection control level signal and through the logical selection method.

More preferably, a safety control state indicator lamp is controlled according to each safety monitoring level signal; when safety hidden hazards exist between the circuit of grounding safety control points, the safety control state indicator lamp is turned on.

More preferably, the step that the grounding safety protection is done according to the safety action level signal further comprises: a safety alarm buzzer and a safety action relay are controlled according to the safety action level signal; when safety hidden hazards exist between the grounding safety control points of at least one circuit, the safety alarm buzzer is rang, and the safety action relay takes the circuit breaker protection action.

More preferably, the step that the grounding safety protection is done according to the safety action level signal further comprises: the safety action level signal is intensified, so as to drive the grounding safety protection action.

More preferably, the following steps are also comprised:

One group of grounding safety control points are set for each piece of equipment whose grounding safety needs to be monitored, and a circuit of grounding safety control points are established by combining one group of grounding safety control points into a grounding safety monitoring circuit.

The invention also provides a grounding safety control point measuring circuit which comprises a comparison module, an output control module and an output module, wherein:

The comparison module at least comprises a safety comparison circuit; each safety comparison circuit is configured as follows: the voltage between the grounding safety control points is compared with the preset grounding safety standard voltage, and the safety monitoring level signal is output;

The output control module comprises at least one input end; each input end is connected with the output end of the safety comparison circuit; the output control module is configured as follows: the received safety monitoring level signal is adjusted to be the safety action level signal which is matched with the output module;

The input end of the output module is connected with the output end of the output control module, and the output module is configured to respond to the safety action level signal which is output by the output control module and do grounding safety protection.

In the technical scheme, within the comparison module, if the voltage between the grounding safety control points is higher than the preset grounding safety standard voltage, the output safety monitoring level signal is high-level (i.e. 1); when the voltage between the grounding safety control points is lower than the preset grounding safety standard voltage, the output safety monitoring level signal is low-level (i.e. 0). Within the output module, the equipment grounding fails if the input safety action level signal is low-level; the equipment grounding is good if the input second level is high-level. The reason for why we say the output control module is used for adjusting the safety monitoring level signal into the safety action level signal which is matched with the output module is that within the comparison module, only the voltage between the grounding safety control points in the circuit is lower than the preset grounding safety standard voltage, i.e. the grounding is normal if the safety monitoring level signal is low-level; but within the output module, the grounding is normal only if the received safety action level signal is high-level, so the received safety monitoring level signal needs to be converted into the safety action level signal through the output control module and output to the output module, so as to meet the needs of circuit design.

More preferably, each safety comparison circuit comprises the first resistor, the second resistor, the third resistor, the resistors between control points to be measured, a comparator, the first power supply and the second power supply, wherein:

The first end of the first resistor is connected with the first power supply, the second end is respectively connected with the first end of the second resistor and the positive input end of the comparator; the second end of the second resistor is grounded; the first end of the third resistor is connected with the second power supply, and the second end is respectively connected with the first ends of the resistors between control points to be measured and the positive input end of the comparator; the second ends of the resistors between control points to be measured are grounded; the output end of the comparator is connected with the input end of the output control module;

Each safety comparison circuit compares the voltage on both ends of the resistors between control points to be measured with that on both ends of the second resistor and outputs the safety monitoring level signal.

In the technical scheme, we can see that the output of the comparator depends on the voltage on both ends of the resistors between control points to be measured (i.e. voltage between the said grounding safety control points) and that on both ends of the second resistor (i.e. the preset grounding safety standard voltage), which the voltage on both ends of the resistors between control points to be measured depends on the ratio of the resistors between control points to be measured-to-(the resistors between control points to be measured+the third resistor), and the voltage on both ends of the second power supply and the second resistor depends on the ratio of the second resistor-to-(the first resistor+the second resistor) and the first power supply; if the voltage on both ends of the resistors between control points to be measured is higher than that on both ends of the second resistor, the comparator outputs high level; if voltage on both ends of the resistors between control points to be measured is lower than that on both ends of the second resistor, the comparator outputs low level; this way, in actual application, that whether the grounding is good or not can be known by monitoring the resistance of the resistors between control points to be measured, so as to realize the monitoring to the grounding of the grounding safety equipment to be monitored.

More preferably, the output control module at least comprises a NOR gate; the input end of the NOR gate is connected with the output end of the safety comparison circuit; each NOR gate outputs a first selection control level signal;

When the number of the safety comparison circuits in the comparison module is an even number, the output end of each safety comparison circuit is connected with one input end in one NOR gate; when the number of the safety comparison circuits in the comparison module is an odd number, the output end of each safety comparison circuit is connected with one input end in one NOR gate, and the input end, of the NOR gate, which is connected with the safety comparison circuit is grounded.

In the technical scheme, in order to realize real-time grounding monitoring to a plurality of pieces of equipment, a plurality of safety comparison circuits are set in the comparison module, and in order to obtain the safety monitoring level signal output by each safety comparison circuit, at least one NOR gate is set in the output control module. We know that usually, one NOR gate comprises two input ends; that is to say, one NOR gate can connect the output ends of two safety comparison circuits. As a result, one circumstance surely occurs in the actual application: when the grounding of a plurality of piece of grounding safety equipment to be monitored does not need to be monitored, the number of the input ends in the output control module (i.e.

the input ends in the NOR gate) is larger than that of the safety comparison circuits, or as mentioned above, the number of the safety comparison circuits is an odd number; at this time, the pins in the NOR gate are surely suspended; in order that the suspended pins do not affect the output result of the whole grounding safety control point measuring circuit, the suspended pins are grounded.

More preferably, the output control module comprises a plurality of NOR gates and at least one AND gate, and outputs the safety action level signal;

The output ends of every two said NOR gates are respectively connected with the input end of the AND gate; the output ends of every two said AND gates are connected with the input end of a third AND gate.

More preferably, the output control module comprises a first NOR gate, a second NOR gate, a third NOR gate, a fourth NOR gate, a first AND gate, a second AND gate and the third AND gate; the comparison module comprises eight safety comparison circuits, wherein:

The eight input ends of the first NOR gate, the second NOR gate, the third NOR gate and the fourth NOR gate are correspondingly connected with the eight output ends of the eight safety comparison circuits one by one; the output ends of the first NOR gate and the second NOR gate are respectively connected with the two input ends of the first AND gate, the output ends of the third NOR gate and the fourth NOR gate are respectively connected with the two input ends of the second AND gate, the output ends of the first AND gate and the second AND gate are respectively connected with the input end of the third AND gate, and the output end of the third AND gate is connected with the input end of the output module;

The first NOR gate, the second NOR gate, the third NOR gate and the fourth NOR gate respectively outputs one first selection control level signal according to the input safety monitoring level signal; the first AND gate and the second AND gate respectively output one second selection control level signal according to the input first selection control level signal; the third AND gate outputs the safety action level signal according to the input second selection control level signal.

More preferably, the grounding safety control point measuring circuit also comprises a plurality of state indicator lamps; each state indicator lamp is respectively connected with the output end of one safety comparison circuit.

More preferably, the output module comprises a buzzer and a relay and the input ends of the buzzer and the relay are respectively connected with the output end of the output control module.

More preferably, the grounding safety control point measuring circuit also comprises an isolation module which intensifies the safety action level signal; the isolation module is arranged between the output control module and the output module, the input end of the isolation module is connected with the output end of the output control module, the output end of the isolation module is connected with the input end of the output module;

The isolation module comprises a first phase inverter and a second phase inverter which are serially connected; the input end of the first phase inverter is connected with the output end of the output control module, and the output end is connected with the input end of the second phase inverter; the output end of the second phase inverter is connected with the input end of the output module.

In the technical scheme, the said isolation module is composed of two phase inverters which are used for isolating the output control module from the output module, and meanwhile are used for improving the driving capability of the whole grounding safety control point measuring circuit.

The invention also provides the equipment grounding measuring system which comprises the grounding safety control point measuring circuit as mentioned in Claim 10 and at least one piece of grounding safety equipment to be measured, and the safety comparison circuits in the grounding safety control point measuring circuit correspond to the grounding safety equipment to be measured one by one;

A grounding safety monitoring loop is formed and a circuit of safety control points are established among one safety comparison circuit, one piece of grounding safety equipment to be measured and the equipment ground.

More preferably, the grounding safety equipment to be measured is grounding equipment in an FCT test station.

The grounding safety control point monitoring method, the measuring circuit and the equipment grounding measuring system have the following beneficial effects:

In the invention, a pass signal or a failure signal is given to the buzzer by acquiring and comparing the grounding impedance of the grounding safety equipment to be measured (voltage on both ends of the resistors between control points to be measured) and standard resistance (voltage on both ends of the second resistor); if the given signal is the failure signal, the buzzer gives an alarm and reminds an operator that the equipment grounding fails, the continuous operation of the equipment is forbidden by cutting off a product test point through the relay; consequently, the personal safety of the operator is guaranteed, and meanwhile the product and equipment safety is protected; in addition, in the grounding safety control point measuring circuit, the output end of each safety comparison circuit is provided with the state indicator lamp which can remind the operator in real time that whether the grounding safety equipment to be measured is normally grounded or not;

Moreover, the grounding safety control point measuring circuit and the monitoring method can monitor a plurality of pieces of grounding safety equipment to be measured at the same time; when more grounding safety equipment to be measured needs to be monitored, extension can be carried out randomly; the grounding safety control point measuring circuit can monitor any grounding safety equipment whose grounding needs to be monitored, and is applied widely.

BRIEF DESCRIPTION OF THE DRAWINGS

Below are the description of the preferable specific embodiments in the understandable way and by integrating the drawings, and the further description of the said characteristics, technical characteristics, advantages and realization methods thereof.

Drawing 1 is the drawing for one example of the grounding safety control point monitoring method.

Figure 1:
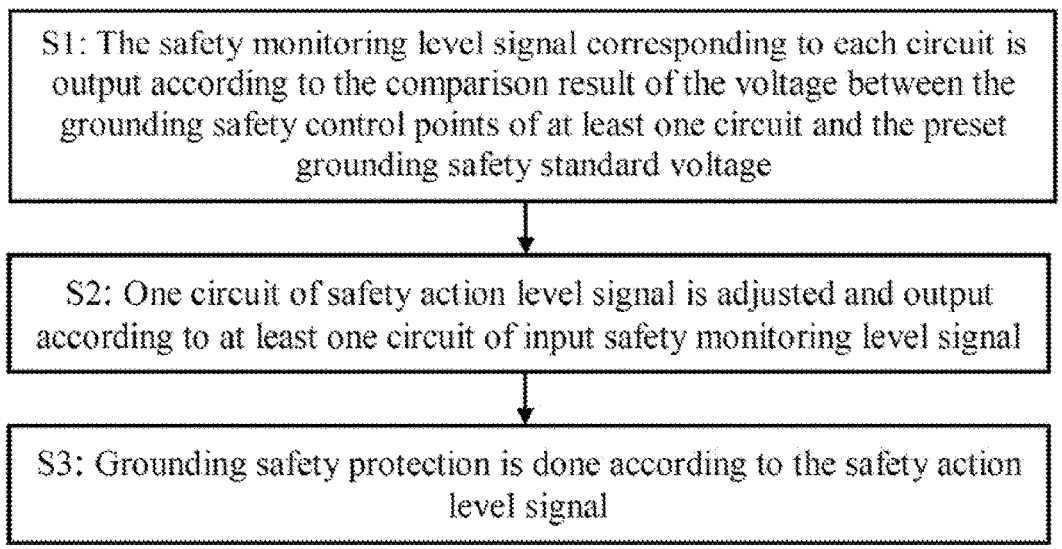
Figure 2:
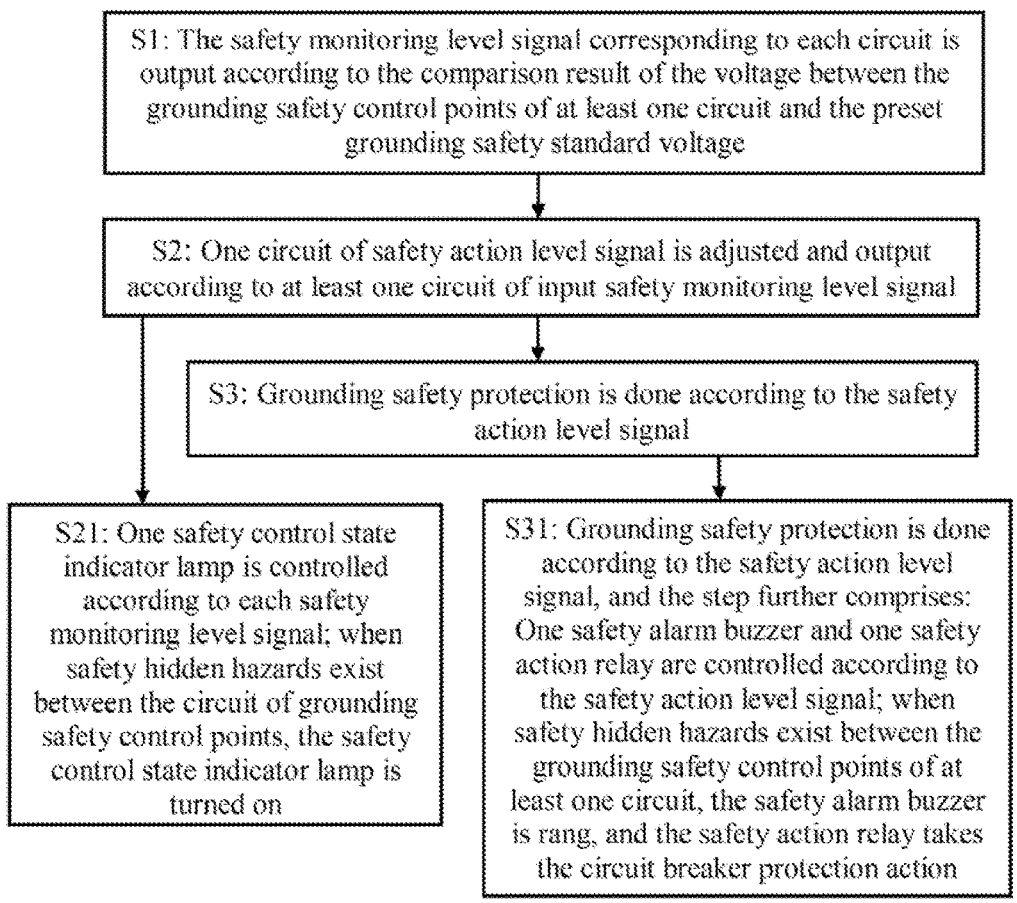
Figure 3:
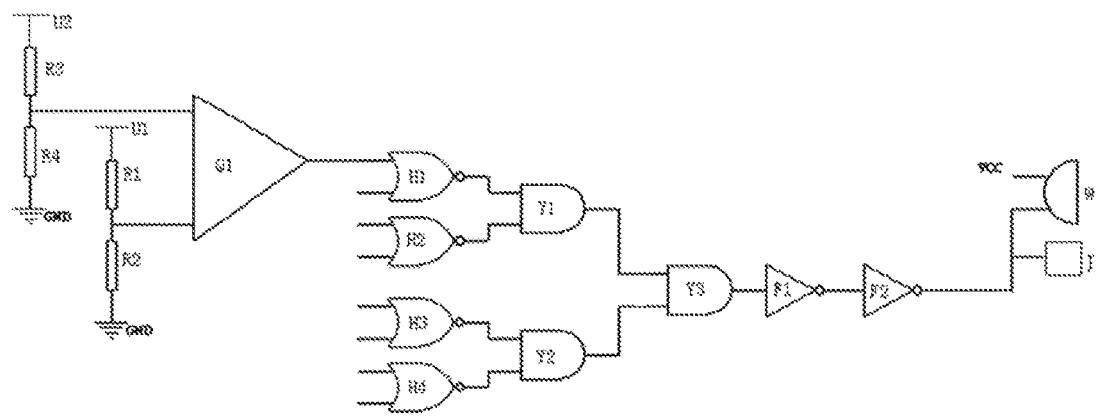
Figure 4:
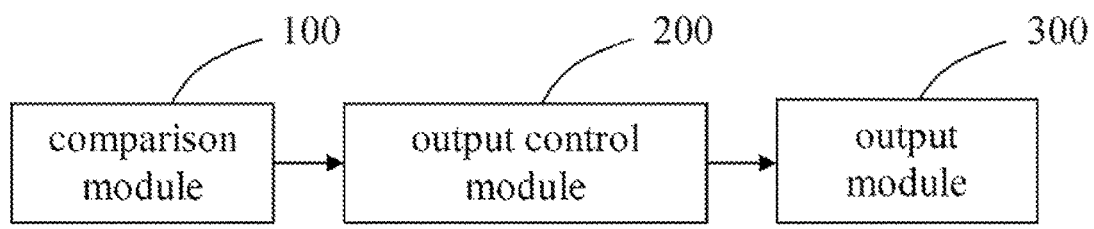
Figure 5:
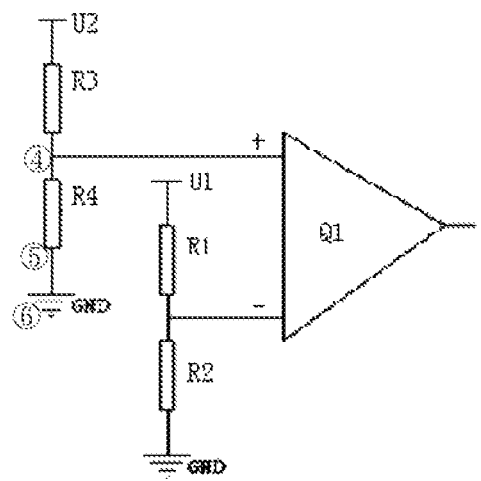
Figure 6:
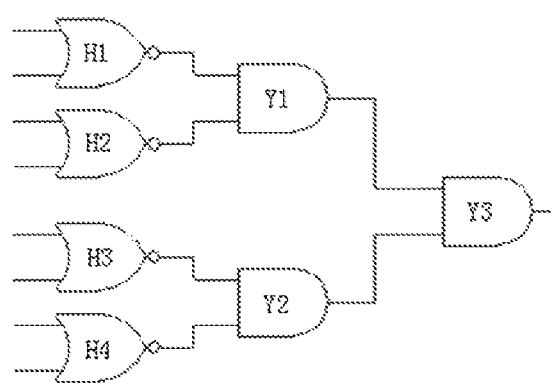
Figure 7:
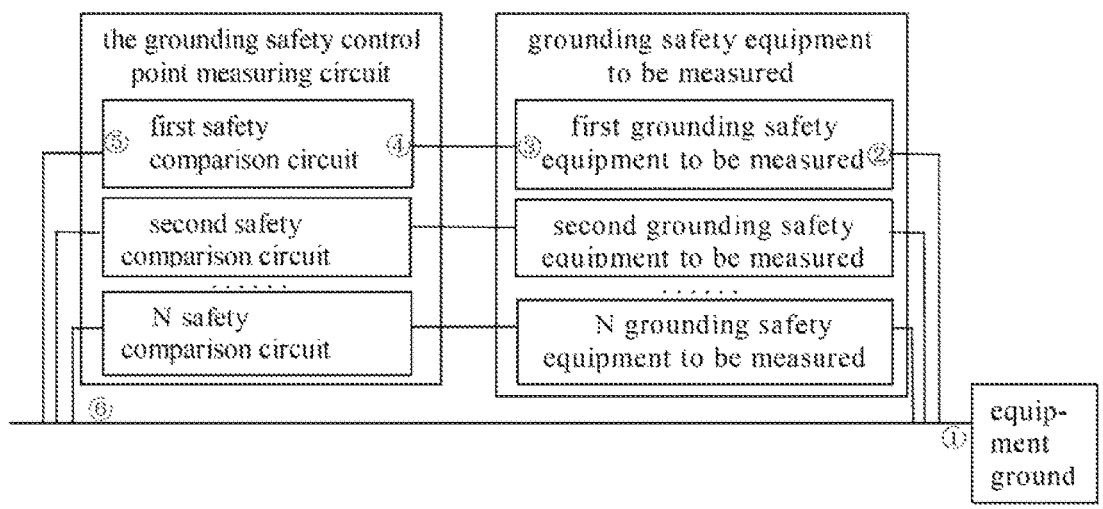

Drawing 2 is the drawing for another example of the grounding safety control point monitoring method.

Drawing 3 is the structural representation of the circuit in the grounding safety control point monitoring method.

Drawing 4 is the structural representation of the grounding safety control point measuring circuit;

Drawing 5 is the circuit diagram of the safety comparison circuit;

Drawing 6 is the circuit diagram for the specific example of the output control module which comprises four NOR gates and three AND gates;

Drawing 7 is the structural representation of the equipment grounding measuring system.

MARKS OF THE DRAWINGS

100—comparison module, 200—output control module, 300—output module,
U1—first power supply, U2—second power supply, R1—first resistor, R2—second resistor, R3—third resistor,
R4—resistors between control points to be measured, Q1—comparator, H1—first NOR gate, H2—second NOR gate, J—safety action relay,
H3—third NOR gate, H4—fourth NOR gate, Y1—first AND gate, Y2—second AND gate,
Y3—third AND gate, F1—first phase inverter, F2—second phase inverter, W—safety alarm buzzer, ①, ②, ③, ④, ⑤, ⑥-control points.

DETAILED DESCRIPTION OF THE INVENTION

In order to more clearly describe the examples of the invention or the technical schemes in the prior art, the specific embodiments of the invention are described below by referring to the drawings. Obviously, drawings in the following description are only some examples of the invention, and ordinary technicians in the field can also obtain other drawings and other specific embodiments according the drawings on the premise of not doing any creative work For example, Drawing 1 is the drawing for one example of the grounding safety control point monitoring method. As in Drawing 1, the grounding safety control point monitoring method comprises the following steps:

S1: The safety monitoring level signal corresponding to each circuit is output according to the comparison result of the voltage between the grounding safety control points of at least one circuit and the preset grounding safety standard voltage;

S2: One circuit of safety action level signal is adjusted and output according to at least one circuit of input safety monitoring level signal;

S3: Grounding safety protection is done according to the safety action level signal.

Drawing 2 is the drawing for another example of the grounding safety control point monitoring method. As shown in Drawing 2, the grounding safety control point monitoring method comprises the following steps:

S1: The safety monitoring level signal corresponding to each circuit is output according to the comparison result of the voltage between the grounding safety control points of at least one circuit and the preset grounding safety standard voltage.

S2: One circuit of safety action level signal is adjusted and output according to at least one circuit of input safety monitoring level signal.

S21: One safety control state indicator lamp is controlled according to each safety monitoring level signal; when safety hidden hazards exist between the circuit of grounding safety control points, the safety control state indicator lamp is turned on.

S3: Grounding safety protection is done according to the safety action level signal.

S31: Grounding safety protection is done according to the safety action level signal, and the step further comprises: One safety alarm buzzer and one safety action relay are controlled according to the safety action level signal; when safety hidden hazards exist between the grounding safety control points of at least one circuit, the safety alarm buzzer is rang, and the safety action relay takes the circuit breaker protection action.

Below is the detailed description to the realization of the grounding safety control point monitoring method through the grounding safety control point measuring circuit as shown in Drawing 3:

As shown in Drawing 3, in the specific example, the circuit which outputs the safety monitoring level signal which corresponds to each circuit according to the comparison result of the voltage between the grounding safety control points of at least one circuit and the preset grounding safety standard voltage (hereinafter referred to as the safety comparison circuit) comprises the first resistor R1, the second resistor R2, the third resistor R3, the resistors between control points to be measured R4, the comparator Q1, the first power supply U1 and the second power supply U2. Wherein, the first end of the first resistor R1 is connected with the first power supply U1, and the second end is respectively connected with the first end of the second resistor R2 and the negative input end of the comparator Q1; the second end of the second resistor R2 is grounded; the grounding safety standard voltage is obtained and output according to the first power supply U1 as well as the first resistor R1 and the second resistor R2 which are connected onto the first power supply and through the resistance division method between the first resistor R1 and the second resistor R2. The first end of the third resistor R3 is connected with the second power supply U2, and the second end is respectively connected with the first ends of the resistors between control points to be measured R4 and the positive input end of the comparator Q1; the second ends of the resistors between control points to be measured R4 are grounded; the voltage between the grounding safety control points is obtained and output according to the second power supply U2, the third resistor R3 which is connected onto the second power supply U2 and the resistors between control points to be measured R4, and through the resistance division method between the third resistor R3 and resistors between control points to be measured R4. The output end of the comparator Q1 is connected with the follow-up NOR gate input end. From the said description we can know that the said safety comparison circuit compares the voltage on both ends of the resistors between control points to be measured R4 (i.e. the voltage between the said control points to be measured) with that on both ends of the second resistor R2 (i.e. the said preset grounding safety standard voltage) and outputs the safety monitoring level signal. In addition, when the voltage on both ends of the resistors between control points to be measured R4 is higher than that on both ends of the second resistor R2, the comparator Q1 outputs high level (i.e. 1); when the voltage on both ends of the resistors between control points to be measured R4 is lower than that on both ends of the second resistor R2, the comparator Q1 outputs low level (i.e. 0), and what the comparator Q1 outputs is the said safety monitoring level signal.

As shown in Drawing 3, in the specific example: one circuit of safety action level signal is adjusted and output according to at least one circuit of input safety monitoring level signal, the specific circuit comprises the first NOR gate H1, the second NOR gate H2, the third NOR gate H3, the fourth NOR gate H4, the first AND gate Y1, the second AND gate Y2 and the third AND gate Y3. Correspondingly, the circuit comprises the eight safety comparison circuits, wherein, the eight input end of the first NOR gate H1, the second NOR gate H2, the third NOR gate H3 and the fourth NOR gate H4 correspond to and are connected with the eight output ends of the eight said safety comparison circuits one by one. NOR gate H1, H2, H3 and H4 output one circuit of first selection control level signal according to each two circuits of safety monitoring level signal in pair and through a logical selection method. Easily understandably, if any one circuit of safety monitoring level signals are not in pair, the first selection control level signal can be directly output, the empty input end of the NOR gate is grounded.

Specifically, the output ends of the first NOR gate H1 and the second NOR gate H2 are respectively connected with the two input ends of the first AND gate Y1, and the output ends of the third NOR gate H3 and the fourth NOR gate H4 are respectively connected with the two input ends of the second AND gate Y2. AND gates Y1 and Y2 output the second selection control level signal according to each pair of first selection control level signals and through the logical selection method. The output ends of the first AND gate Y1 and the second AND gate Y2 are respectively connected with the input end of the third AND gate Y3, and the output end of the third AND gate Y3 is connected with a follow-up grounding safety protection realization circuit. The AND gate Y3 outputs the safety action level signal according to a plurality of circuits of said second selection control level signal and through the logical selection method. Above is the introduction to that AND gates Y1, Y2 and Y3 output the safety action level signal according to a plurality of circuits of said first selection control level signals and through the logical selection method.

Obtain the safety monitoring level signal output by each safety comparison circuit, at least one NOR gate is set in the output control module.

In the said technical scheme, in order to realize real-time grounding monitoring to a plurality of pieces of equipment, a plurality of safety comparison circuits are set, and in order to obtain each circuit of safety comparison output safety monitoring level signal, two circuits of safety monitoring level signal are connected into a pair. The first selection control level signal is directly output for the safety monitoring level signals not in pairs.

As shown in Drawing 3, in the specific example, the grounding safety protection realization circuit comprises the safety alarm buzzer W and the safety action relay J, the input ends of the safety alarm buzzer W and the safety action relay J are respectively connected with the output end of the third AND gate Y3; the grounding of the grounding safety equipment to be measured is good if the safety action level signal is high-level; the grounding safety equipment to be measured has grounding equipment when the safety action level signal is low-level, at this time the safety alarm buzzer W gives an alarm and reminds the operator that the outlet wire of the grounding safety equipment to be measured fails to work, and meanwhile the safety action relay J disconnects the working points of the grounding safety equipment to be measured, so that the grounding safety equipment to be measured stops working. Of course, the safety alarm buzzer W is connected with the output end of the third AND gate Y3, and is connected with a power supply VCC.

As shown in Drawing 3, in the specific example, the circuit also comprises a driving part which is used for intensifying the signals; the driving part comprises the first phase inverter F1 and the second phase inverter F2 which are serially connected, and the input end of the first phase inverter F1 is connected with the output end of the third AND gate Y3. The output end of the first phase inverter F1 is connected with the input end of the second phase inverter F2; the output end of the second phase inverter F2 are connected with the input ends of the safety alarm buzzer W and the safety action relay J; in the example, the purpose can be achieved by the 74LS05 phase inverter and of course phase inverters with other models can be also used, and there is no limitation. The first phase inverter F1 and the second phase inverter F2 are used for intensifying the safety action level signals, so as to drive the grounding safety protection action.

In another example, the circuit also comprises a plurality of safety control state indicator lamps, and each safety control state indicator lamp is respectively connected with the output end of one output end of the safety comparison circuit (i.e. respectively connected with the input end of each NOR gate). The safety comparison circuit outputs low level if the grounding of the grounding safety equipment to be measured is good, and the safety control state indicator lamp shows normally; the safety comparison circuit which correspondingly outputs is high level when the grounding of the grounding safety equipment to be measured fails, the corresponding safety control state indicator lamp is off to remind the operator.

Drawing 4 is the structural representation of the grounding safety control point measuring circuit, and we can see that the grounding safety control point measuring circuit comprises the comparison module 100, the output control module 200 and the output module 300, wherein, the output end of the comparison module 100 is connected with the input end of the output control module 200, and the output end of the output control module 200 is connected with the input end of the output module 300.

Wherein, the comparison module 100 at lease comprises one safety comparison circuit, each safety comparison circuit is configured as comparing the voltage between the grounding safety control points and the preset grounding safety standard voltage and outputting the safety monitoring level signal. As shown in Drawing 5, each safety comparison circuit comprises the first resistor R1, the second resistor R2, the third resistor R3, the resistors between control points to be measured R4, the comparator Q1, the first power supply U1 and the second power supply U2, wherein the first end of the first resistor R1 is connected with the first power supply U1, and the second end is respectively connected with the first end of the second resistor R2 and the negative input end of the comparator Q1; the second end of the second resistor R2 is grounded; the first end of the third resistor R3 is connected with the second power supply U2, and the second end is respectively connected with the first ends of the resistors between control points to be measured R4 and the positive input end of the comparator Q1; the second ends of the resistors between control points to be measured R4 are grounded; the output end of the comparator Q1 is connected with the input end of the output control module 200.

From the said description we can know that the safety comparison circuit compares the voltage on both ends of the resistors between control points to be measured R4 (i.e. the voltage between the said grounding safety control points) with that on both ends of the second resistor R2 (i.e. the said preset grounding safety standard voltage) and outputs the safety monitoring level signal. When the voltage on both ends of the resistors between control points to be measured R4 is higher than that on both ends of the second resistor R2, the comparator Q1 outputs high level (i.e. 1); when the voltage on both ends of the resistors between control points to be measured R4 is lower than that on both ends of the second resistor R2, the comparator Q1 outputs low level (i.e.

0). From the composition of the safety comparison circuit we can see that voltage on both ends of the resistors between control points to be measured R4 depends on the ratio of the resistors between control points to be measured R4-to-(the resistors between control points to be measured R4+the third resistor R3) and the second power supply U2, and the voltage on both ends of the second resistor R2 depends on the ratio of the second resistor R2-to-(the first resistor R1+the second resistor R2) and the first power supply U1.

In one specific example, if the first power supply U1 and the second power supply U2 are 3.3V power supplies, the resistance of the first resistor R1 is 100K, the resistance of the second resistor R2 is 1K, the resistance of the third resistor R3 is 1000, and the model of the comparator Q1 is LM324. Then in the example, the ratio of the second resistor R2-to-(the first resistor R1+the second resistor R2) is 1/(1+101)=1/101; because the resistance of the third resistor R3 is 1000, when the grounding of the grounding safety equipment to be measured is monitored by the safety comparison circuit, if the resistance of the resistors between control points to be measured R4 is more than 1Ω, the voltage of the positive input end of the comparator Q1 is higher than that of the negative input end, and the safety monitoring level signal output by the comparator Q1 is high-level; when the resistance of the resistors between control points to be measured R4 is less than 1Ω, the voltage of the positive input end of the comparator Q1 is lower than that of the negative input end, and the safety monitoring level signal output by the comparator Q1 is low-level. As a result, that whether the grounding of the equipment is good or not can be known by monitoring the resistance of the resistors between control points to be measured R4, so as to realize the real-time monitoring to the grounding of the grounding safety equipment to be measured. What needs to be described is that in the example, there is no limitation to the specific models of the said comparator Q1, two power supplies and all the resistors. That is to say, in other examples, that the comparator Q1 outputs according to the voltage on both ends of the resistors between control points to be measured R4 and that on both ends of the second resistor R2 is included in the summary of the invention; if the resistance of the first resistor R1 is 100K, the resistance of the second resistor R2 is 1K, the third resistor R3 is 3000, and the first power supply U1 and the second power supply U2 are 3.3V; at this time, during a testing process, that whether the equipment is normally grounded or not can be known by comparing the tested resistors between control points to be measured R4 and 30; simply speaking, it is feasible as long as the measurement reference value of the resistors between control points to be measured R4 can be determined according to the values of the first resistor R1, the second resistor R2, the third resistor R3, the first power supply U1 and the second power supply U2.

The output control module 200 at least comprises one input end, each input end is connected with the output end of one safety comparison circuit, and the output control module 200 is configured as adjusting the received safety monitoring level signal into the safety action level signal which is matched with the output module 300. Specifically, the output control module 200 at least comprises one NOR gate, the input end of the NOR gate is connected with the output end of the safety comparison circuit, i.e. the input end of the NOR gate serves as the input end of the output control module 200. When the number of the safety comparison circuits in the comparison module 100 is an even number, the output end of each safety comparison circuit is connected with one input end in one NOR gate; when the number of the safety comparison circuits in the comparison module 100 is an odd number, the output end of each safety comparison circuit is connected with one input end in one NOR gate, and the input end, of the NOR gate, which is connected with the safety comparison circuit is grounded.

What needs to be described is that because in the comparison module 100, when the voltage of the resistors between control points to be measured R4 is lower than the preset grounding safety standard voltage, i.e. the safety monitoring level signal output by the safety comparison circuit is low-level, the grounding of the grounding safety equipment to be measured is good; while in the output module 300, when the input second level is high level, the grounding of the grounding safety equipment to be measured is good, and that means the substantial role of the output control module 200 is to negate the safety monitoring level signal and obtain the safety action level signal.

However, in the example that the comparison module 100 only comprises one safety comparison circuit, the negation of the level can be realized without the NOR gate in the output control module 200, the purpose can be achieved as long as a NOT gate is arranged between the comparison module 100 and the output module 300; of course, if the comparison module 100 comprises a plurality of safety comparison circuits, the problem cannot be solved by simply adding the NOT gate between the comparison module 100 and the output module 300. Moreover, under the circumstance in which only one safety comparison circuit exists, the number of the safety comparison circuits is odd according to the said description; at this time, the said purpose can be also achieved if the output end of the safety comparison circuit is connected with one output end in the NOR gate and another input end in the NOR gate is grounded.

Furthermore, when the comparison module 100 comprises two safety comparison circuits, the purpose can be achieved by respectively connecting the two output end of the safety comparison circuits with the two input ends of the NOR gate; here, a connection method which can be adopted in the output control module 200 when the comparison module 100 comprises one or two safety comparison circuits. For the circumstance in which the comparison module 100 comprises a plurality of safety comparison circuits (more than three circuits), the output control module 200 comprises a plurality of NOR gates and at least one AND gate; in addition, the output ends of every two NOR gates are respectively connected with the input end of the AND gate, the output ends of every two AND gates are respectively connected with the input end of a third AND gate, the third AND gate is for distinguishment from the said two AND gates, i.e. when the number of the AND gates in the output control module 200 is the multiple of 3, the connection method of the AND gate is as follows: the output ends of every two AND gates are respectively connected with the two input ends of another AND gate.

In the specific example, as shown in Drawing 6, the output control module 200 comprises the first NOR gate H1, the second NOR gate H2, the third NOR gate H3, the fourth NOR gate H4, the first AND gate Y1, the second AND gate Y2 and the third AND gate Y3; the comparison module 100 comprises the eight safety comparison circuits; wherein the eight input ends of the first NOR gate H1, the second NOR gate H2, the third NOR gate H3 and the fourth NOR gate H4 are connected with the eight output ends of the eight safety comparison circuits one by one, the output ends of the first NOR gate H1 and the second NOR gate H2 are respectively connected with the two input ends of the first AND gate Y1, the output ends of the third NOR gate H3 and the fourth NOR gate H4 are respectively connected with the two input ends of the second AND gate Y2, the output ends of the first AND gate Y1 and the second AND gate Y2 are respectively connected with the input end of the third AND gate Y3, and the output end of the third AND gate Y3 is connected with the input end of the input end. Corresponding with the monitoring method, in the example, each first NOR gate, second NOR gate, third NOR gate and fourth NOR gate output one first selection control level signal according to the input safety monitoring level signal, the first AND gate and the second AND gate respectively output one second selection control level signal according to the input first selection control level signal, and the third AND gate outputs the safety action level signal according to the input second selection control level signal.

As we describe above, when the comparison module 100 comprises the eight safety comparison circuits, the output control module 200 comprises 4 NOR gates and 3 AND gates, and the grounding safety control point measuring circuit measures the connection of all devices in the output control module 200 when the grounding safety equipment is to be measured with eight safety comparison circuits at the same time; what needs to be described is that, under any one circumstance of the connection and applicability to one to eight pieces of grounding safety equipment to be measured, e.g. when the grounding of only one piece of grounding equipment with measurement needs to be monitored, the comparison module 100 only needs to output one safety comparison circuit, connects the output end of the safety comparison circuit with any one of the eight input ends of the four NOR gates, and then grounds the pins, in the eight input ends, which are not connected into the safety comparison circuit, and the purpose can be achieved; in other examples, the same method is adopted, i.e. the suspended pins which are not connected into the safety comparison circuit are grounded, and the purpose can be achieved. Of course, during the design process of the output control module 200, the method of monitoring the eight pieces of grounding safety equipment to be measured simultaneously does not need to be adopted, and other methods can be also adopted, e.g. the output control module 200 comprises two NOR gates and one AND gate, so as to realize the simultaneous monitoring to four grounding safety equipment to be measured; for another example, the output control module 200 comprises eight NOR gates and six AND gates, so as to realize the monitoring to sixteen pieces of grounding safety equipment to be measured, the users can design freely according to the actual application needs, and there is no limitation. Furthermore, in the example, the chips of the four NOR gates can be input through the 2 with the model of 74LS02 to realize the connection of all the NOR gates, the chips of the four AND gates are input through 2 with the model of 74LS08 to realize the connection of all the AND gates, and of course, the purpose can be also achieved through chips with other models, and there is no limitation.

The input end of the input end is connected with the output end of the output control module 200, and the output module 300 is configured as responding to the safety action level signal output by the output control module 200. In the specific example, the output module 300 comprises the buzzer W and the relay J, and the input ends of the buzzer W and the relay J are respectively connected with the output end of the output control module 200; the grounding of the grounding safety equipment to be measured is good if the safety action level signal which is input to the output module 300 is high-level; if the grounding safety equipment to be measured has grounding equipment when the safety action level signal is low-level, the buzzer W gives an alarm and reminds the operator that the outlet wire of the grounding safety equipment to be measured fails to work, and meanwhile the relay J disconnects the working points of the grounding safety equipment to be measured, so that the grounding safety equipment to be measured stops working. Of course, buzzer W is connected with the output end of the output control module 200 and needs to be connected with the power supply VCC.

In one specific example, the grounding safety control point measuring circuit also comprises a plurality of state indicator lamps, and each state indicator lamp is respectively connected with one output end of the safety comparison circuit (i.e. respectively connected with each input end in the output control module 200). The safety comparison circuit outputs low level if the grounding of the grounding safety equipment to be measured is good, and the state indicator lamp shows normally; the safety comparison circuit which correspondingly outputs is high level when the grounding of the grounding safety equipment to be measured fails, the corresponding state indicator lamp is off to remind the operator.

In one specific example, the grounding safety control point measuring circuit also comprises the isolation module which intensifies the safety action level signal. The isolation module is arranged between the output control module 200 and the output module 300, the input end of the isolation module is connected with the output end of the output control module 200, and the output end of the isolation module is connected with the input end of the input end.

Specifically, the isolation module comprises the first phase inverter F1 and the second phase inverter F2 which are serially connected, the input end of the first phase inverter F1 is connected with the output end of the output control module 200, and the output end is connected with the input end of the second phase inverter F2; the output end of the second phase inverter F2 is connected with the input end of the input end, and in the example, the purpose can be achieved by the 74LS05 phase inverter, and of course, phase inverters with other models can be also used, and there is no limitation.

Drawing 3 shows the specific example of the grounding safety control point measuring circuit which comprises the isolation module; as shown in the drawing, the output control module 200 comprises four NOR gates and three AND gates; the suspension of the input end, of the NOR gate, which is not connected with the safety comparison circuit does not mean the input end is not connected with the safety comparison circuit; the reason is that one safety comparison circuit is only schematically drawn in the comparison module 100; from the drawing we can see that the grounding of the grounding safety equipment to be measured is good if the output of the output end of the isolation module is 1; the grounding of the grounding safety equipment to be measured fails if the output of the output end of the isolation module is 0, at this time the buzzer W gives warning, and the relay J controls to disconnect the working points of the grounding safety equipment to be measured.

The invention also provides the equipment grounding measuring system which comprises the said grounding safety control point measuring circuit and at least one piece of grounding safety equipment to be measured; wherein, in the grounding safety control point measuring circuit, the safety comparison circuits correspond to the grounding safety equipment to be measured one by one. As shown in Drawing 7, the first safety comparison circuits correspond to the first pieces of grounding safety equipment to be measured one by one; second safety comparison circuits correspond to second pieces of grounding safety equipment to be measured one by one, . . . , and Nth safety comparison circuits correspond to Nth pieces of grounding safety equipment to be measured one by one; of course; the circumstance under which a plurality of pieces of grounding safety equipment to be measured and a plurality of safety comparison circuits are only schematically drawn; when only one piece of grounding safety equipment to be measured needs to be monitored, only one safety comparison circuit needs to be connected, and so forth.

In the actual measurement, the grounding safety monitoring loop is formed among the safety comparison circuit, the grounding safety equipment to be measured and the equipment ground. Below is an example of the grounding safety monitoring loop which is formed between the first safety comparison circuit and the first piece of grounding safety equipment to be measured for describing the process: the grounding safety monitoring loop comprises a control point ④ and a control point ⑤; the first piece of grounding safety equipment to be measured comprises a control point ② and a control point ③; the equipment ground comprises a control point ① and a control point ⑥; wherein, the control point ③ and the control point ① are respectively two points, of the first piece of grounding safety equipment to be measured, which are originally connected with the equipment ground during an operation process, the control point ④ and the control point ③ are two points for the connection of the first piece of grounding safety equipment to be measured in the grounding safety control point monitoring method, and the control point ⑤ and the control point ① are respectively two points for the connection between the circuit to the equipment ground in the grounding safety control point monitoring method. In the actual application, the grounding safety monitoring loop is used for monitoring the grounding of the first piece of grounding safety equipment to be measured in the order of the control point ④, the control point ③, the control point ②, the control point ①, the control point ⑥ and finally the control point ⑤, and the grounding safety monitoring loop is formed. Therefore, one group of grounding safety control points are set for each piece of equipment whose grounding safety needs to be monitored, and a circuit of safety control points are established by combining each group of grounding safety control points into one grounding safety monitoring loop.

What needs to be described is that, as shown in Drawing 5, the control point ④ and the control point ⑤ are actually points on both ends of the resistors between control points to be measured R4 (the voltage between the control point ④ and the control point ⑤ is the voltage between the control points as described in the safety comparison circuit), and the control point ⑥ is the grounding point of the resistors between control points to be measured R4. Actually, the resistor between control points to be measured R4 is not a true resistor; during the wiring process of the circuit, the resistor between control points to be measured R4 comprises an outer shell in the circuit, a copper wire, etc., i.e. nothing is connected between the control point ④ and control point ⑤ during the wiring process; when the grounding of the first piece of grounding safety equipment to be measured is monitored, that whether the resistance between the control point ④ and the control point ⑤ meets the requirement in the circuit design process or not only needs to be tested. From Drawing 7 we can see that when the grounding of the first piece of grounding safety equipment to be measured fails, the corresponding safety control state indicator lamp is off, and the safety alarm buzzer W gives an alarm. Moreover, what is noticeable is that when the grounding of a plurality of pieces of grounding safety equipment to be measured is monitored simultaneously and the grounding from the control point ① to the control point ⑥ and to the control point ⑤ fails, all the safety control state indicator lamps are off, meanwhile the safety alarm buzzer W gives an alarm to remind the operator to troubleshoot; when other control points have problems, only safety control state indicator lamps on the corresponding lines are off. In the specific example, the grounding safety equipment to be measured is the grounding equipment in the FCT test station What needs to be states is that the said examples can be combined freely on demand. The embodiments are only preferable specific embodiments of the invention. What needs to be pointed out is that ordinary technicians in the technical field can make further improvement and coloring on the premise of not deviating from the principle of the invention, and such improvement and coloring shall also be considered within the protection scope of the invention.

What is claimed is:

1. A grounding safety control point monitoring method, comprising the following steps:
    a) comparing a voltage between grounding safety control points and a preset grounding safety standard voltage in a safety comparison circuit of each grounding safety equipment, then outputting safety monitoring level signals each corresponding to the safety comparison circuit of each grounding safety equipment respectively based on comparison results;
    b) adjusting and then outputting a safety action level signal; and
    c) performing grounding safety protection according to the safety action level signal;
    wherein the grounding safety standard voltage is obtained according to a first power supply, a first resistor and a second resistor both connected onto the first power supply and through a resistance division method between the first resistor and the second resistor; and
    the voltage between the grounding safety control points is obtained and output according to a second power supply, a third resistor connected onto the second power supply, and resistors between control points to be measured, and through the resistance division method of the third resistor and the resistors between control points to be measured.

2. The grounding safety control point monitoring method according to claim 1, wherein after step a and before step b, further comprising the steps of:
    pairing up the safety monitoring level signals, and then performing a logical selection method to output first selection control level signals each corresponding to each pair of safety monitoring level signals paired up;
    wherein, if one of the safety monitoring level signals is not in pair, a first selection control level signal is directly output corresponding to the one of the safety monitoring level signals that is not in pair.

3. The grounding safety control point monitoring method according to claim 2, wherein,
    after outputting the first selection control level signals, pairing up the first selection control level signals, and then performing a logical selection method to output second selection control level signals each corresponding to each pair of first selection control level signals; and
    the safety action level signal is output according to the second selection control level signals through a logical selection method.

4. The grounding safety control point monitoring method according to claim 1, further comprising controlling safety control state indicator lamps each corresponding to each of the safety monitoring level signals; when potential safety hazards exist between the grounding safety control points of any one safety comparison circuit of a corresponding grounding safety equipment, a corresponding safety control state indicator lamp of said any one safety comparison circuit having the potential safety hazards is turned on.

5. The grounding safety control point monitoring method according to claim 1, wherein performing grounding safety protection in step c further comprises the following steps: controlling a safety alarm buzzer and a safety action relay according to the safety action level signal; when potential safety hazards exist between the grounding safety control points of any one safety comparison circuit of a corresponding grounding safety equipment, the safety alarm buzzer is rang, and the safety action relay takes circuit breaker protection action.

6. The grounding safety control point monitoring method according to claim 5, further comprising the step of intensifying the safety action level signal to drive the grounding safety protection.

7. The grounding safety control point monitoring method according to claim 1, further comprising the following steps before step a:
setting one group of the grounding safety control points for each grounding safety equipment whose grounding safety needs to be monitored, and establishing the safety comparison circuit of the grounding safety control points by combining said one group of the grounding safety control points into a grounding safety monitoring circuit.

8. A grounding safety control point measuring circuit, comprising a comparison module, an output control module and an output module, wherein:
the comparison module comprises at least one safety comparison circuit;
each safety comparison circuit is configured as follows: a voltage between grounding safety control points is compared with a preset grounding safety standard voltage to output a safety monitoring level signal;
the output control module comprises at least one input end; each input end is connected with an output end of a corresponding safety comparison circuit;
the output control module is configured as follows: the safety monitoring level signal output from each safety comparison circuit received by the output control module is adjusted to be a safety action level signal which is matched with the output module;
an input end of the output module is connected with an output end of the output control module, and the output module is configured to respond to the safety action level signal output by the output control module and perform grounding safety protection;
each safety comparison circuit comprises a first resistor, a second resistor, a third resistor, resistors between control points to be measured, a comparator, a first power supply and a second power supply, wherein:
a first end of the first resistor is connected with the first power supply, a second end of the first resistor is respectively connected with a first end of the second resistor and a positive input end of the comparator; a second end of the second resistor is grounded;
a first end of the third resistor is connected with the second power supply, and a second end of the third resistor is respectively connected with first ends of the resistors between control points to be measured and the positive input end of the comparator; second ends of the resistors between control points to be measured are grounded; an output end of the comparator is connected with the at least one input end of the output control module;
each safety comparison circuit compares a voltage on both ends of the resistors between control points to be measured with that on both ends of the second resistor, and outputs the safety monitoring level signal.

9. The grounding safety control point measuring circuit according to claim 8, wherein, the output control module comprises at least one NOR gate; an input end of each NOR gate is connected with the output end of a corresponding safety comparison circuit; each NOR gate outputs a first selection control level signal;
when safety comparison circuits in the comparison module has a quantity which is an even number, the output end of each safety comparison circuit is connected with the input end of a corresponding NOR gate; when the safety comparison circuits in the comparison module has a quantity which is an odd number, the output end of each safety comparison circuit is connected with the input end of a corresponding NOR gate, and the input end of the NOR gate which is not connected with any safety comparison circuit is grounded.

10. The grounding safety control point measuring circuit according to claim 9, wherein, the output control module comprises a plurality of NOR gates and at least one AND gate, and outputs the safety action level signal;
output ends of every two said NOR gates are respectively connected with an input end of one AND gate; output ends of every two said AND gates are connected with an input end of a third AND gate.

11. The grounding safety control point measuring circuit according to claim 10, wherein, the output control module comprises a first NOR gate, a second NOR gate, a third NOR gate, a fourth NOR gate, a first AND gate, a second AND gate and the third AND gate; the comparison module comprises eight safety comparison circuits, wherein:
eight input ends of the first NOR gate, the second NOR gate, the third NOR gate and the fourth NOR gate are correspondingly connected with eight output ends of the eight safety comparison circuits respectively; output ends of the first NOR gate and the second NOR gate are respectively connected with two input ends of the first AND gate, output ends of the third NOR gate and the fourth NOR gate are respectively connected with two input ends of the second AND gate, output ends of the first AND gate and the second AND gate are respectively connected with the input end of the third AND gate, and an output end of the third AND gate is connected with the input end of the output module;
the first NOR gate, the second NOR gate, the third NOR gate and the fourth NOR gate respectively outputs one first selection control level signal according to the safety monitoring level signal being respectively input; the first AND gate and the second AND gate respectively output one second selection control level signal according to the first selection control level signal being respectively input; the third AND gate outputs the safety action level signal according to the second selection control level signal.

12. The grounding safety control point measuring circuit according to claim 8, wherein, the grounding safety control point measuring circuit also comprises a plurality of state indicator lamps; each state indicator lamp is respectively connected with the output end of one safety comparison circuit.

13. The grounding safety control point measuring circuit according to claim 8, wherein, the output module comprises a buzzer and a relay, and input ends of the buzzer and the relay are respectively connected with the output end of the output control module.

14. The grounding safety control point measuring circuit according to claim 13, wherein, the grounding safety control point measuring circuit also comprises an isolation module which intensifies the safety action level signal; the isolation module is arranged between the output control module and the output module, an input end of the isolation module is connected with the output end of the output control module, an output end of the isolation module is connected with the input end of the output module;

the isolation module comprises a first phase inverter and a second phase inverter which are serially connected; an input end of the first phase inverter is connected with the output end of the output control module, and an output end of the first phase inverter is connected with an input end of the second phase inverter;
an output end of the second phase inverter is connected with the input end of the output module.

* * * * *